US005191242A

United States Patent [19]

Agrawal et al.

[11] Patent Number: 5,191,242

[45] Date of Patent: Mar. 2, 1993

[54] PROGRAMMABLE LOGIC DEVICE INCORPORATING DIGITAL-TO-ANALOG CONVERTER

[75] Inventors: Om P. Agrawal, San Jose, Calif.; Michael J. Wright, Boulder, Colo.

[73] Assignee: Advanced Micro Devices, Inc., Sunnyvale, Calif.

[21] Appl. No.: 701,790

[22] Filed: May 17, 1991

[51] Int. Cl.⁵ .......... H03K 19/177

[52] U.S. Cl. .......... 307/465; 364/600

[58] Field of Search .......... 307/465–469, 307/243, 272.2; 364/600–602, 716

[56] References Cited

U.S. PATENT DOCUMENTS

| | | | |
|---|---|---|---|
| 4,057,711 | 11/1977 | Asthana et al. | 364/600 |
| 4,074,357 | 7/1978 | Gupta et al. | 364/601 X |
| 4,190,898 | 2/1980 | Farnsworth et al. | 341/155 X |
| 4,250,556 | 2/1981 | Goser | 364/600 |
| 4,499,549 | 2/1985 | Bartlett | 364/601 |
| 4,530,065 | 7/1985 | Huff | 364/600 |
| 4,792,913 | 12/1988 | Buckland et al. | 364/602 |

*Primary Examiner*—David Hudspeth

*Attorney, Agent, or Firm*—Fliesler, Dubb, Meyer & Lovejoy

[57] ABSTRACT

An integrated circuit device which implements a plurality of programmable digital logic functions derived from a number of digital logic inputs and further includes an on-chip digital-to-analog converter providing an analog output current signal responsive to the programmable logic functions derived from the digital inputs is provided. The means for implementing the programmable logic functions may include a programmable logic circuit having a programmable AND array comprising a plurality of AND gates, each with a plurality of inputs and at least one output. The AND gate inputs are selectively programmable with the input terms to generate an output signal to the AND gate outputs. The device further includes an OR gate array having a plurality of OR gates, each of the OR gates including a plurality of inputs and an output, thereby providing a plurality of OR gate array outputs generating a plurality of digital logic signals. The digital-to-analog converter includes a plurality of inputs coupled to a subset of the plurality of OR gate array outputs for converting the digital signals present on the OR gate array outputs into a variable amplitude output signal. In one embodiment, an 8-to-8 encoder providing the outputs of the subset of OR gate array outputs to the inputs of the digital-to-analog converter is also included.

24 Claims, 2 Drawing Sheets

PROGRAMMABLE LOGIC DEVICE INCORPORATING DIGITAL-TO-ANALOG CONVERTER

BACKGROUND OF THE INVENTION

1. Field of the Invention

The invention relates to integrated circuit devices incorporating programmable logic to provide user programmable output functions, and specifically, devices which provide analog signal outputs.

2. Description of the Related Art

Programmable logic devices (PLD), including the programmable array logic (PAL) device and the programmable gate array, are integrated circuits which can be configured by the user to perform logic functions on digital inputs. PLDs offer digital designers a flexible and cost-effective implementation for complex logic circuits and the best alternative amongst a spectrum of products ranging from fully customized integrated circuits to standard, dedicated-purpose devices.

A typical PAL includes a programmable array of AND gates, and a fixed array of OR gates. In other programmable logic devices, both the AND and the OR arrays are programmable. The outputs of such combinatorial logic arrays used in programmable logic circuits may be coupled directly to an I/O pin, or input to clockable registers. In many devices, the combinatorial logic array outputs are registered and are fed back to the inputs of the combinatorial array. Some programmable logic circuits also include a clockable input synchronizing register located between an input pin and one of the inputs to the combinatorial array. PAL is a trademark of Advanced Micro Devices, Inc. See, Advanced Micro Devices, Inc. PAL ® *Device Handbook,* (1988).

The programmable logic device has thus given the digital designer a means for reducing circuit size through higher integration, ease of design and documentation by software specification, and the security of keeping one's own design proprietary.

It is desirable to provide a single integrated circuit which has both analog and digital functional components working together to provide an analog output signal responsive to digital inputs which are acted upon by programmable logic functions. Such a device allows great flexibility and programmability by allowing analog outputs to be derived from programmable digital solutions.

One simple solution to this objective is presented in the X9MME E$^2$POT Digitally Controlled Potentiometer by Xicor Corporation, Milpitas, Calif., which provides ninety-nine (99) increment, resistor ladder controlled by a digitally decoded counter which includes the capability of storing the count value in non-volatile memory on power down. In addition, several types of digital-to-analog converters are well known in the art, including the "weighted resistor" and the "ladder network" types of DACS. However, to the best of applicants' knowledge, no devices have been provided which provide programmable logic circuitry and a digital-to-analog converter in a integrated circuit device.

SUMMARY OF THE INVENTION

The present invention is an integrated circuit device which includes a means for implementing a plurality of programmable digital logic functions derived from a number of digital logic inputs and further includes an on-chip digital-to-analog conversion means for providing an analog output current signal responsive to the programmable logic functions derived from the digital inputs. The present invention includes a programmable logic circuit having a programmable AND array including a plurality of input terms and a plurality of AND gates. Each of the plurality of AND gates includes a plurality of AND gate inputs and at least one AND gate output. The AND gate inputs are selectively programmable with the input terms to generate an output signal to the AND gate outputs. The invention further includes an OR gate array having a plurality of OR gates, each of the plurality of OR gates including a plurality of OR gate inputs. Each of the plurality of OR gates includes an output thereby providing a plurality of OR gate array outputs generating a plurality of digital logic signals.

The digital-to-analog conversion means includes a plurality of inputs coupled to a subset of the plurality of OR gate array outputs is provided for converting the digital signals present on the OR gate array outputs into a variable amplitude output signal. In one embodiment, the digital-to-analog conversion means includes a digital-to-analog converter and an 8- to-8 encoder for providing the outputs of the subset of OR gate array outputs to the inputs of the digital-to-analog converter.

BRIEF DESCRIPTION OF THE DRAWINGS

The invention will be described with respect to the particular embodiments thereof. Other objects, features, and advantages of the invention will become apparent with reference to the specification and drawings in which.

DESCRIPTION OF THE PREFERRED EMBODIMENTS

The invention will be described herein with reference to the preferred embodiments. However, it should be understood that numerous variations and modifications will be understood by those skilled in the art as within the context of the invention.

Figure 1:
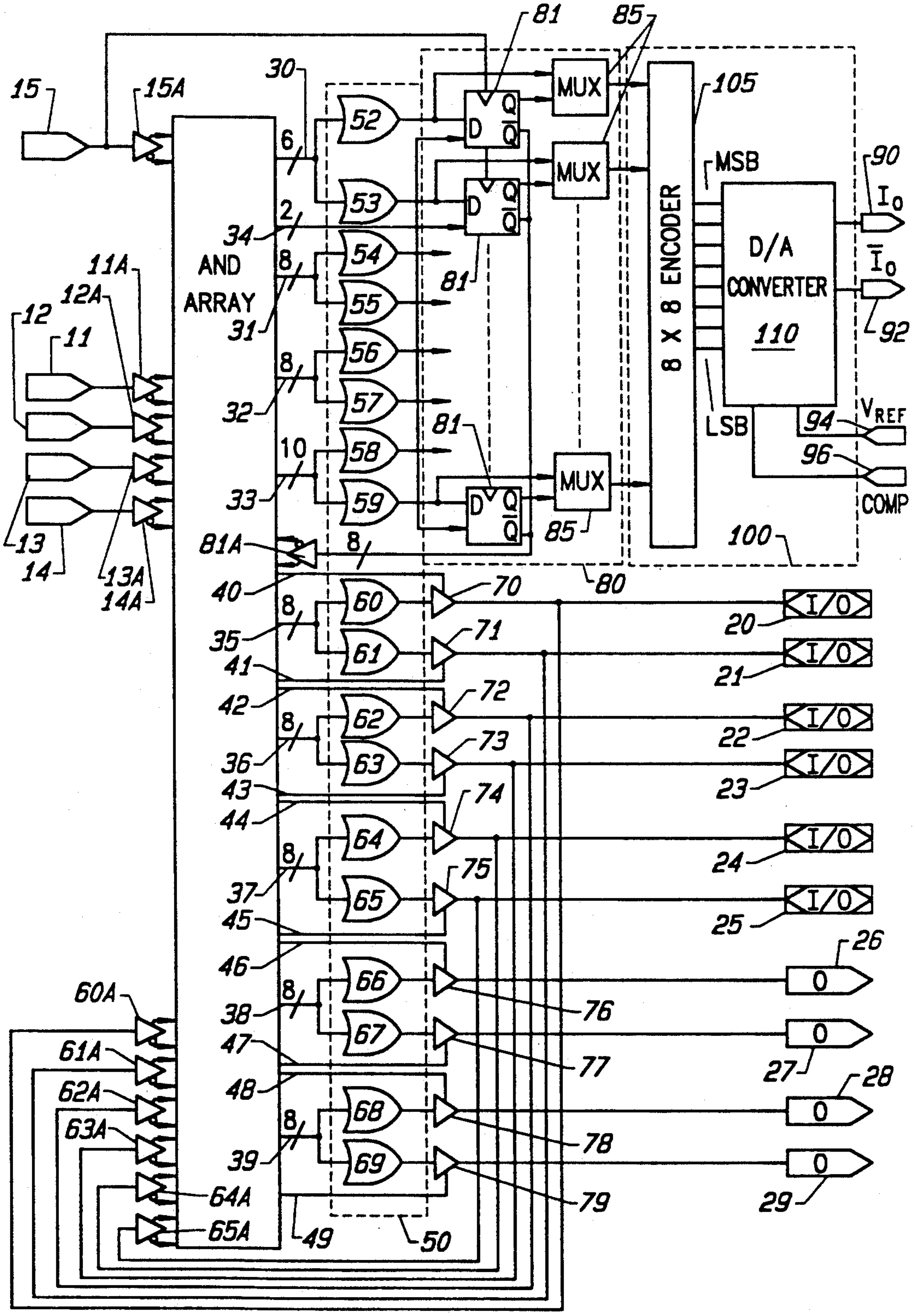
FIG. 1 is a chip-level block diagram of the integrated circuit of the present invention.

The integrated circuit of the present invention is shown in FIG. 1. The present invention provides a user with a Programmable Logic Device for implementing a plurality of programmable digital logic functions derived from a number of digital logic inputs for provision to a number of outputs. In addition, the device includes an on-chip digital-to-analog converter (DAC) for providing an analog output current signal responsive to the programmed logic functions derived from the digital inputs.

The integrated circuit device of the present invention thus provides an apparatus which enhances performance of programmable logic devices and digital-to-analog converters. Such a device is useful in standard digital-to-analog conversions, specifically 8-bit digital-to-analog conversions. The device is further useful for waveform synthesis in such applications as waveform code generation, speech synthesis, and digital recording reconstruction.

In general, the integrated circuit device of the present invention includes a programmable array logic (PAL) device, for providing a number of digital function outputs, and digital-to-analog (D/A) conversion means 100, for providing an analog current output derived form the digital outputs of the PAL. The PAL includes programmable AND array 10, fixed input OR array 50, and output block 80. One portion of the outputs of the fixed OR array 50 is coupled to digital-to-analog conversion means 100 for providing the analog output signal based on the digital output signals of the output block 80. A second portion of the outputs of OR array 50 is provided to input/output pins 20–25. A third portion of the outputs of fixed OR array 50 is provided to dedicated output pins 26–29.

In such a configuration, the device provides a user with a number of input/output options, combined with the ability to generate an analog output signal useful in a variety of applications. The specific functions of each of the aforementioned components will be hereinafter described with reference to FIGS. 1 and 2.

Programmable AND array 10 includes a plurality of input terms, divided into a number of sets, which may be selectively programmed by the user to generate digital logic signals on AND gate outputs 30–49. AND gate outputs 30–49 serve as inputs to a plurality of OR gates 52–69 included within OR array 50. One set of input terms is derived from input pins 11–14 which are respectively coupled to input buffers **11*a*–14*a*. The digital input signals from input pins 11–14, and complements, are provided via input buffers 11*a*–14*a* as input terms to AND array 10. A clock input signal, and its complement, are provided via input buffer 15*a*, which is coupled to clock input pin 15. A second set of input terms to AND array 10 is derived from a subset of the outputs of OR array 50, coupled via buffers 60*a*–65*a*, as will be discussed in further detail below. Yet another set of input terms is derived from the complementary data outputs of eight D-type flip-flops 81, comprising a portion of output block 80, which are input via eight buffers 81*a* to provide the data signals present on the complementary data outputs (Q) of D-type flip-flops 81, and their complement, as inputs to AND array 10. Programmable AND array 10 thereafter generates a number of output signals or "product terms" which are provided via output lines 30–49 for use by the fixed input OR array 50** as inputs.

Fixed input OR array 50 includes a plurality of OR gates generally arranged in three sets: OR gates 52–59, OR gates 60–65, and OR gates 60–69. Within each set of OR gates, each individual OR gate has associated therewith with another OR gate, thereby forming an OR gate pair. Both gates in the pair share a plurality of AND array outputs as inputs. Thus, the OR gate pair comprised of OR gates 52 and 53 shares set 30 of six AND array outputs; OR gates 54 and 55 share set 31 of eight AND array outputs; OR gates 56 and 57 share set 32 of eight AND array outputs; and OR gates 58 and 59 share set 33 of ten AND array outputs. Likewise, OR gates 61 and 62 share set 35 of eight AND array outputs; OR gates 62 and 63 share set 36 of eight AND array outputs; and OR gates 64 and 65 share set 37 of eight AND array outputs. Additionally, OR gates 66 and 67 share set 38 of eight AND array outputs, and OR gates 68 and 69 share set 39 of eight AND array outputs.

In above description, each set of AND array outputs 30–39, comprising a plurality of individual AND gate outputs, is coupled to each of the OR gates in the respective OR gate pair with which the set is associated. Thus, the programmable logic device incorporates the concept of product term sharing wherein only one of the OR gates in each of the aforementioned OR gate pair may utilize an individual one of the product term outputs in any of the particular sets 30–39 of AND array outputs as an input at any given time. Once one of the product terms in sets 30–39 is programmed to give a function to a particular OR gate in the OR gate pair, that particular product term cannot be programmed to provide a functional output from the other OR gate in the particular pair. For example, if one of the product terms in set 30 is programmed to give function to OR gate 52, that particular product term is no longer available to OR gate 53.

While it is within contemplation of the invention to utilize a configuration wherein a particular product term can be used as an input to both OR gates in a particular pair, such a configuration results in propagation delay penalties. The above-described use of product term sharing allows the distribution of product terms to be better organized, thereby yielding less overall redundancy. The same functionality in conventional PAL architecture would require an array twice the size, because each output would require its own set of product terms. AND output sets 30–34 contain different numbers of product terms since less overall redundancy in the usage of the product terms will be achieved assuming that some of the outputs which are provided to digital-to-analog conversion means 100 via output block 80 will not require many terms, while others may require up to nine terms.

As noted above, OR gates 52–69 are generally arranged in three sets. A first set of OR gates 60–65 has outputs coupled to the inputs of buffers 70–75. The outputs of buffers 70–75 are coupled to input/output pins 20–25, respectively. As noted above, each of the input/output pins 20–25 and the output of buffers 70–75 is coupled to buffers **60*a*–65*a*, respectively, providing input terms to AND array 10. AND gate product terms 40 and 41 are coupled to the enable inputs of buffers 70–71, respectively; product terms 42 and 43 are coupled to the enable inputs of buffers 72 and 73, respectively; and product terms 44 and 45 are coupled to the enable inputs of buffers 74 and 75, respectively. Thus, by programming product terms 40–45 the user can select whether input/output pins 20–25 will be utilized as inputs or outputs to the array, and/or whether OR gates 60–65 will be utilized as feedback inputs to AND array 10**.

A second set of OR gates 66–69 are dedicated output gates, with each OR gate 66–69 having its output coupled via buffers 76–79, respectively, to output pins 26–29, respectively. AND array product terms 46 and 47 are coupled to the enable inputs of buffers 76 and 77, respectively; and product terms 48 and 49 are coupled to the enable inputs of buffers 78 and 79, respectively. Thus, the user can program gates 66–69 to selectively provide outputs to pins 26–29, respectively.

OR gates 60–69 utilize the concept of product term sharing discussed above, however, in the instance where the particular I/O pin 20–25 corresponding to a particular OR gate 60–65 is utilized as an input, the remaining product terms coupled to the gate set of which the particular OR gate is a part are available to the other OR gate in the pair. For example, OR gate pair 60–61 shares product term set 35 comprising eight product terms. If either pin 20 or 21 is used as an input to the array, the corresponding OR gate may utilize all products terms in product term set 35. This is true for OR gate pairs 62–63 with product term set 36, and OR gate pair 60–65 with product term set 37. Careful selection by the user will yield the best arrangement of product terms in the device for the particular application. The provision of eight potential device outputs is designed to give the user the ability to interface to individual components or to 8-bit data/control buses, and further to allow additional inputs and outputs for the device.

While sets 30–39 are described as having quantities specific of AND outputs in each set, it will be recognized by those skilled in the art that any number of product terms may be shared by each OR gate pair.

Output block 80 includes eight D-type flip-flops 81 comprising output registers for a third set of OR gates 52–59. Each of the D-type flip-flops 81 includes a data input D, a clock input, a preset/reset input, a data output Q, and a complementary data output Q. Each of the clock inputs of D-type flip-flops 81 is coupled in parallel with clock input pin 15. Further, each of the preset/reset inputs of D-type flip-flops 81 is coupled in parallel to AND gates output set 34 having two AND gate outputs. The PAL thus includes common, asynchronous preset/reset of registers 81. The output of each of the OR gates in the first set of OR gates 52–59 is coupled to one of the data inputs of one of the plurality of D-type flip-flops 81 in output block 80.

A plurality of multiplexers 85 is provided which allows the user to switch between a combinatorial (OR gate) output or a registered (Q) output from the OR array for provision to the PAL. Each multiplexer 85 has one input coupled to the output of one of the OR gates 52–59. A second input of each of multiplexer's 85 is coupled to the data output of one of the plurality of flip-flops 81. The output of the multiplexers 85 provides the digital inputs to the digital-to-analog conversion means 100. The complementary data output of each of the plurality of D-type flip-flops 81 is coupled via a plurality of buffers 81*a* to provide input terms to AND array 10, as discussed above.

Digital-to-analog conversion means 100 is comprised of an 8×8 encoder 105 and a digital-to-analog converter 110. Encoder 105 is provided to allow the user to direct the eight outputs of multiplexers 85 to the correct inputs of digital-to-analog converter 110. This allows the user to select which output from the PAL will drive which bit of the eight bits in the digital-to-analog converter (DAC) 110, allowing optimal use of the PAL to provide the necessary eight bits. Encoder 105 may be comprised of, for example, eight separate eight-to-one (8:1) multiplexers controlled by fuses of the same nature as used in array 10. Each multiplexer is contemplated as being programmable in the same manner as AND array 10, e.g. by fuse state or EEPROM cell, and will be programmed at the same time as AND array 10.

Digital-to-analog converter 110 provides a variable current output to output pin 90 and its compliment to output pin 92. A reference voltage is provided via input pin 94 and a COMP input is provided via input pin 96.

Figure 2:
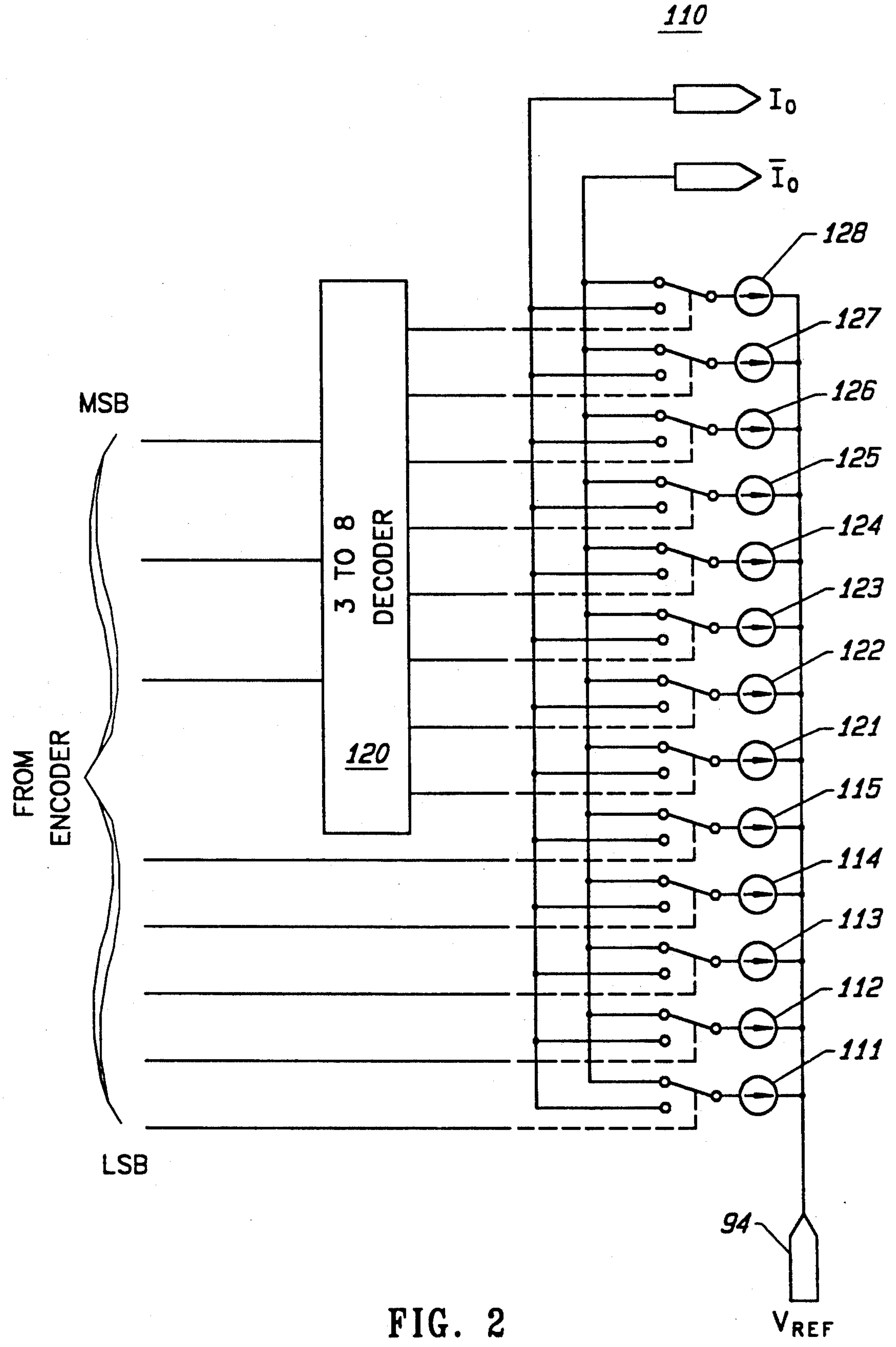
FIG. 2 is a block diagram of the preferred embodiment of the digital-to-analog converter network utilized in the present invention.

The particular features of digital-to-analog converter 110 are is described with reference to FIG. 2. Digital-to-analog converter 110 is similar to a conventional digital-to-analog converter wherein each of the digital inputs to the converter drive a current switch network which provides the variable current output from the device. The reference voltage (V−), input via pin 94, sets the maximum output of the digital-to-analog converter. As is well known in the art, DAC 110 can operate as a multiplying DAC by varying the reference voltage ($V_{ref}$) input. The architecture of DAC 110 is segmented with the five least-significant bits (LSB) driving five binary-weighted current sources 111–115, e.g. I, 2I, 4I, 8I, 16I. The three most-significant bits are provided to 3-to-8 decoder 120 which fully decodes three bits to drive eight equally-weighted current sources 121–128 32I. As a result, the output current of DAC 110 is related to the digital input and the reference current, derived from the $V_{ref}$ input, as follows:

$$I_o = \frac{X}{255} \cdot I_{ref}$$

where X is the number input to the DAC from encoder 105.

Thus the digital-to-analog converter of the present invention provides 8-bit resolution with 12-bit accuracy. In an embodiment where two such devices are used, a 16-bit resolution with 12-bit accuracy can be achieved, however, in such an apparatus, the four least-significant bits will no longer have guaranteed accuracy.

The invention has been described with respect to the particular embodiments thereof. Numerous variations are possible as will be apparent to a person of ordinary skill in the art after reading the present specification. For example, though the invention has been particularly described with respect to a particular size of AND array, the number of inputs and outputs to the programmable AND array may vary. Further, although the invention has been described with respect to a PAL, any number of programmable logic devices may be utilized in the present invention such as, for example, a PROM device having a fixed AND array and a programmable OR array, or a PLS device where both the AND and OR arrays are programmable. Still further, although only a one digital-to-analog conversion means has been shown on the particular device, depending on the device size, a number of digital-to-analog converters may be provided on-chip. These variations and others are intended to be within the scope of the present invention as defined by the specification, claims, and drawings.

What is claimed is:

1. A single integrated circuit, comprising:

a programmable logic circuit having at least one logic circuit input and a plurality of logic circuit outputs, each of said plurality of logic circuit outputs providing a digital logic signal;

means for providing a variable amplitude analog signal to an output means, responsive to said plurality of digital output signals provided on said plurality of programmable logic circuit outputs, said means for providing including input means for receiving said plurality of signals; and means for coupling said plurality of outputs of said programmable logic circuit to said input means.

2. The integrated circuit of claim 1 wherein said programmable logic circuit comprises a programmable AND array having a plurality of inputs and a plurality of outputs, a first subset of said plurality of inputs being selectively coupleable with said at least one of said plurality of logic circuit inputs, and a fixed input OR array including a plurality of OR gates, each of said plurality of OR gates having a plurality of OR gate inputs and an OR gate output.

3. The integrated circuit of claim 2 wherein said plurality of OR gates includes a first OR gate having a first plurality of OR gate inputs coupled to a plurality of AND array outputs in one of a plurality of subsets of said AND array outputs, said plurality of OR gates including a second OR gate associated with said first OR gate, said second OR gate having a second plurality of inputs coupled to said plurality of AND array outputs in said one of said plurality of subsets.

4. The integrated circuit of claim 2 wherein a first subset of said plurality of OR gate outputs is provided to said means for coupling, said first subset of OR gate outputs for providing said digital output signals to said means for providing.

5. The integrated circuit of claim 4 wherein a second subset of said plurality of OR gate outputs is coupled to a second subset of said plurality of AND array inputs.

6. The integrated circuit of claim 4 wherein said means for coupling comprises a register array including a plurality of D-type flip-flops, each said flip-flop being associated with one output in said first subset of said plurality of OR gate outputs, having a data input coupled to said associated output of said first subset of said plurality of OR gate outputs, and having a data output;

a multiplexer array including a plurality of multiplexers, each said multiplexer being associated with one of said plurality of flip-flops, having at least two inputs and at least one output, a first of said inputs being coupled to one of said first set of said plurality of OR gate outputs and a second of said inputs being coupled to the data output of said one of said plurality of flip-flops associated with said one of said first set of said plurality of OR gate outputs and an encoder having a plurality of inputs and a plurality of outputs, each of said plurality of inputs of said encoder being coupled to one of said outputs of said plurality of multiplexers, each of said plurality of outputs of said encoder being coupled to said means for providing.

7. The integrated circuit of claim 6 wherein each said flip-flop further includes a complementary data output, each said complementary data output being coupled to an output in a second subset of said plurality of AND array inputs.

8. The integrated circuit of claim 1 wherein said means for providing comprises an 8-bit digital-to-analog converter having a current output and a complimentary current output.

9. A single integrated circuit device, comprising:

a programmable logic circuit, including a programmable AND array having a plurality of input terms and a plurality of AND gates, each of said plurality of AND gates having a plurality of AND gate inputs and at least one AND gate output, said AND gate inputs being selectively programmable with said input terms to generate output signals on said AND gate outputs;

an OR gate array having a plurality of OR gates, each of said plurality of OR gates including a plurality of OR gate inputs, at least one of said plurality of OR gate inputs being coupled to one of said plurality of AND gate outputs, each of said plurality of OR gates including an output thereby providing a plurality of OR gate array outputs for providing a plurality of digital signals; and digital-to-analog conversion means having a plurality of inputs coupled to a subset of said plurality of OR gate array outputs for converting the digital signals present on said plurality of OR gate array outputs of said subset into a variable amplitude output signal.

10. The integrated circuit of claim 9 wherein said plurality of OR gates includes a first and second OR gates and said at least one of said plurality of OR gate inputs includes at least two of said plurality of OR gate inputs, a first of said at least two OR gate inputs associated with said first OR gate, and a second of said at least two OR gate inputs associated with said second OR gate.

11. The integrated circuit of claim 9 wherein a first set of said plurality of OR gates includes at least a first and second OR gates, each of said plurality of OR gate inputs of said first OR gate having associated therewith one of said plurality of inputs of said second OR gate, each of said plurality of first and second OR gate inputs and its associated input being coupled to an output in first subset of said plurality of said AND array outputs, said outputs of said first set of said plurality of OR gates being coupled to said digital-to-analog conversion means.

12. The integrated circuit of claim 11 wherein said OR array includes a second subset of said plurality of OR gates, said second subset of said plurality of OR gates including at least a third and a fourth OR gates, each of said OR gate inputs of said third OR gate having associated therewith one of said plurality of inputs of said fourth OR gate, each of said plurality of OR gate inputs of said third and fourth OR gates and its associated input being coupled to an output in second subset of said plurality of said AND array outputs, said plurality of outputs in said second subset of OR array outputs being coupled to a plurality of output means.

13. The integrated circuit of claim 12 wherein said OR array includes a third subset of said plurality of OR gates, said third subset of said plurality of OR gates including at least a fifth and a sixth OR gates, each of said plurality of OR gate inputs of said fifth OR gate having associated therewith one of said plurality of inputs of said sixth OR gate, each of said plurality of fifth and sixth OR gate inputs and its associated input being coupled to an output in third subset of said plurality of said AND array outputs, said plurality of outputs in said third subset of OR array outputs being coupled to a plurality of input/output means.

14. The integrated circuit of claim 13 wherein said third subset of OR gates have outputs further provided to a second subset of AND array inputs.

15. The integrated circuit of claim 12 further including a plurality of output buffers, each of said plurality of buffers having an input and an output, each said buffer further being associated with one of said plurality of OR gates in said second subset of said plurality of OR gates and coupled between said associated one of said plurality of OR gates in said second subset of OR gates and said output means, each of said output buffers further being responsive to a one of a plurality of AND array outputs in a fourth subset of AND array outputs to enable each said buffer to pass the signal present at its input to its output.

16. The integrated circuit of claim 13 further including a plurality of output buffers each having an input an output, each of said plurality of buffers associated with one of said plurality of OR gates in said third subset of said plurality of OR gates and coupled between said associated one of said plurality of OR gates in said third plurality of OR gates and said input/output means, each of said output buffers further being responsive to a one of a plurality of AND array outputs in a fifth subset of AND array outputs to enable each said buffer to pass the signal present at its input to its output.

17. An integrated circuit device, comprising:

at least one input pin;

at least one output pin;

a programmable AND gate array having at least one input coupled to said at least one input pin, said AND array further having at least one output;

an OR gate array having at least one input coupled to said at least one output of said AND gate array, said OR gate array having at least a first and second outputs wherein at least said first output is coupled to said output pin;

at least one output register having an input coupled to said second output of said OR gate array, said output register having at least one output;

an encoder having at least one input coupled to said output of said output register said encoder further having at least two output means; and a digital-to-analog conversion means having at least two inputs coupled to said at least two outputs of said encoder means for providing a variable amplitude current to an output wherein the amplitude of said current is responsive to the signals output from said encoder means.

18. The integrated circuit device of claim 17 wherein said at least one output of said AND array includes a plurality of AND array outputs and said OR array includes a plurality of OR gate pairs, each OR gate in said OR gate pair having a plurality of inputs in common with the other OR gate in said OR gate pair, each of said plurality of inputs being coupled to one of a plurality of outputs in one of a number of sets of said plurality of AND gate outputs.

19. The integrated circuit device of claim 18 wherein a first subset of said plurality of OR gate pairs comprise four pairs of OR gates, each of said four pairs sharing one of four subsets of a first set of said plurality of AND gate outputs, a first pair sharing a subset of six AND outputs, a second and third pairs each sharing a subset of eight AND outputs, and a fourth pair sharing a subset of ten AND outputs.

20. The integrated circuit device of claim 19 wherein said at least one output register comprises at least eight D-type flip-flops, one of said flip-flops being associated with one of said OR gates in said first, second, third, or fourth OR gate pair and coupled to the output of said associated OR gate.

21. The integrated circuit device of claim 20 wherein said output register further includes a plurality of multiplexers, each of said plurality of multiplexers being associated with one of said OR gates in said first, second, third, or forth OR gate pair, each said multiplexer further having at least two inputs, one of said multiplexer inputs being coupled to said associated OR gate output, the second of said multiplexer inputs being coupled to said data output of said flip-flop, said multiplexer for selectively providing said OR gate output or said data output of said flip-flop to said encoder.

22. The integrated circuit device of claim 21 wherein said encoder includes at least eight inputs and at least outputs, said encoder for selectively providing a signal present at one of said at least eight inputs to one of said at least eight outputs.

23. The integrated circuit device of claim 22 wherein said digital to analog conversion means includes at least eight inputs coupled to said at least eight outputs of said encoder, said digital to analog conversion means for providing a variable amplitude current having an amplitude proportional to the value of the binary number represented by the sequence of said eight inputs to said digital-to-analog conversion means.

24. An integrated circuit device, comprising:

a plurality of device input pins, device output pins, and device input/output pins;

an output register having a plurality of data inputs and data outputs;

a programmable array logic device, including

- a programmable AND array having a plurality of inputs and a plurality of outputs, a first subset of said plurality of inputs being coupled to at least one of said plurality of device input pins,
- a fixed input OR array having a plurality of OR gates each having a plurality of OR gate inputs and OR gate outputs, each of said plurality of OR gate inputs being coupled to a subset of said AND array outputs, each of said plurality of OR gates having associated therewith another of said plurality of OR gates coupled to said subset of AND array outputs, wherein
- a first subset of said plurality of OR gate outputs is coupled to said plurality of device output pins,
- a second subset of said plurality of OR gate outputs is coupled to a plurality of device input/output pins and to a second subset of said plurality of AND array inputs, and
- a third subset of said plurality of OR gate outputs is coupled to said data inputs of said output register;

an encoder having a plurality of inputs coupled to said plurality of data outputs of said output register, said encoder having a plurality of outputs; and a digital-to-analog conversion means having a plurality of inputs coupled to said plurality of encoder outputs for providing a variable amplitude current signal to one of said plurality of device output pins.

* * * * *